United States Patent
Kurahashi et al.

(10) Patent No.: US 6,924,502 B2
(45) Date of Patent: Aug. 2, 2005

(54) SEMICONDUCTOR LIGHT EMITTING DEVICE FOR STABLY OBTAINING PEAK WAVE LENGTH OF EMISSION SPECTRUM

(75) Inventors: Takahisa Kurahashi, Kashiba (JP); Hiroshi Nakatsu, Tenri (JP); Hiroyuki Hosoba, Souraku-gun (JP); Tetsurou Murakami, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/270,593

(22) Filed: Oct. 16, 2002

(65) Prior Publication Data

US 2003/0038284 A1 Feb. 27, 2003

Related U.S. Application Data

(62) Division of application No. 09/883,497, filed on Jun. 19, 2001, now Pat. No. 6,548,824.

(30) Foreign Application Priority Data

Jun. 21, 2000 (JP) ........................................ 2000-186217
Feb. 27, 2001 (JP) ........................................ 2001-052006

(51) Int. Cl.$^7$ ..................... H01L 29/06; H01L 31/0328; H01L 31/0336; H01L 31/072; H01L 31/109
(52) U.S. Cl. .......................................... 257/14; 257/84
(58) Field of Search ..................................... 257/14, 84

(56) References Cited

U.S. PATENT DOCUMENTS

| | | | |
|---|---|---|---|
| 5,068,868 A | | 11/1991 | Deppe et al. |
| 5,093,695 A | | 3/1992 | Cunningham et al. |
| 5,394,424 A | * | 2/1995 | Ijichi et al. ................... 372/46 |
| 5,621,750 A | * | 4/1997 | Iwano et al. .................. 372/96 |
| 5,877,038 A | * | 3/1999 | Coldren et al. ............... 438/39 |
| 6,008,067 A | * | 12/1999 | Ramdani et al. .............. 438/46 |
| 6,028,693 A | * | 2/2000 | Fork et al. ................... 359/248 |
| RE36,802 E | * | 8/2000 | Geels et al. ................... 372/45 |
| 6,201,780 B1 | * | 3/2001 | Katayama .............. 369/112.19 |
| 6,423,984 B1 | | 7/2002 | Kato et al. |
| 6,429,461 B1 | * | 8/2002 | Tanaka et al. ................. 257/91 |
| 6,548,824 B2 | | 4/2003 | Kurahashi et al. |

FOREIGN PATENT DOCUMENTS

| | | |
|---|---|---|
| JP | 05-275739 | 10/1993 |
| JP | 06-350132 | 12/1994 |
| JP | 07-038151 | 2/1995 |
| JP | 07-162036 | 6/1995 |
| JP | 07-335973 | 12/1995 |
| JP | 09-266355 | 10/1997 |
| JP | 09-326505 | 12/1997 |
| JP | 11-087843 | 3/1999 |
| JP | 2000-058910 | 2/2000 |

\* cited by examiner

*Primary Examiner*—Mary Wilczewski
*Assistant Examiner*—Monica Lewis
(74) *Attorney, Agent, or Firm*—Nixon & Vanderhye P.C.

(57) ABSTRACT

A semiconductor light emitting device has in sequence on a semiconductor substrate, a multilayer reflection film, a semiconductor layer, and a quantum well active layer. A distance between an upper surface of the multilayer reflection film and a lower surface of the quantum well active layer is $2\lambda/n$ or less, where $\lambda$ is a light emission wavelength and n is an average refractive index of the semiconductor layer disposed in between the multilayer reflection film and the quantum well active layer. A phase difference between a reflected ray of light reflected by the multilayer reflection film and an emitted ray of light from the quantum well active layer is a multiple of $2\pi$. The semiconductor light emitting device stably obtains a specified peak wavelength even when there is slight variance in the distance between the upper surface of the multilayer reflection film and the lower surface of the quantum well active layer.

15 Claims, 8 Drawing Sheets

SEMICONDUCTOR LIGHT EMITTING DEVICE FOR STABLY OBTAINING PEAK WAVE LENGTH OF EMISSION SPECTRUM

This application is a division of application Ser. No. 09/883,497, filed Jun. 19, 2001, now U.S. Pat. No. 6,548,824, the entire content of which is hereby incorporated by reference in this application.

BACKGROUND OF THE INVENTION

The present invention relates to a semiconductor light emitting device for use in optical transmission, particularly in IEEE (Institute of Electrical and Electronics Engineers) 1394, and in display or the like.

In recent years, semiconductor light emitting devices have being broadly applied on such fields as optical communication and information display panels. The semiconductor light emitting devices for use in these applications are required to have high luminous efficiency. In particular, it is important for the semiconductor light emitting devices for use in optical communication to have high response speed.

Recently, a POF (Plastic Optical Fiber) has been started to be used in communication in relatively short distance. As a light source of the POF, there has been developed a surface-emitting rapid-response LED (Light Emitting Diode) having an emission wavelength in the vicinity of 650 nm, which is a low loss wavelength range for the POF. The active layer of this semiconductor light emitting device is made from an AlGaInP (Aluminum Gallium Indium Phosphide) based semiconductor material capable of high efficiency light emission, and has structure of quantum well. As a means to improve light extraction efficiency of the semiconductor light emitting device, a DBR (Distributed Bragg Reflector) is introduced as a multilayer reflecting film with high reflectance placed in between the active layer and a GaAs (Gallium Arsenide) substrate.

FIG. 9 is a view showing an emission spectrum of a semiconductor light emitting device having an active layer provided with the DBR and the quantum well structure, in which the distance between the DBR and the quantum well layer, that is, the distance between the upper surface of the DBR and the lower surface of the quantum well active layer is approximately 1 $\mu$m. In FIG. 9, a horizontal axis represents a wavelength of light (nm) while a vertical axis represents relative intensity of light (a.u.: arbitrary unit). When the semiconductor light emitting device emits a ray of light, a ray of light reflected by a DBR on the lower side of the active layer and returned back to the active layer is absorbed little by the active layer and radiated from the semiconductor light emitting device. This is because the active layer having the quantum well structure is extremely small in thickness. Here, an emitted ray of light from the active layer is modulated through interference with a reflected ray of light reflected by the DBR. This changes the spectrum of the ray of light. More particularly, as seen from an emission spectrum configuration in FIG. 9, troughs caused by the interference appear at an interval of approximately 30 to 40 nm in wavelength, generating sub peaks in both sides of a main peak having a wavelength of approximately 665 nm. This indicates that a phase difference between the ray of light reflected by the DBR and the ray of light emitted from the active layer is approximately a multiple of 2π.

However, in the prior art semiconductor light emitting device, the emission spectrum configuration is considerably changed with variance in a distance between the upper surface of the DBR and the lower surface of the active layer, causing a change in the peak wavelength. More particularly, in the semiconductor light emitting device having the emission spectrum shown in FIG. 9, a few % increase in the distance between the upper surface of the DBR and the lower surface of the active layer forms an emission spectrum configuration as shown in FIG. 10. Compared with the emission spectrum configuration in FIG. 9, the peak in FIG. 9 is replaced with a trough of the emission spectrum configuration in FIG. 10, and the wavelength of the main peak moves to a short wavelength side by approximately 15 nm to be approximately 650 nm. In other words, a slight change in the distance between the upper surface of the DBR and the lower surface of the active layer transforms a peak of interference to a trough, causing a displaced peak wavelength.

In the case where the semiconductor light emitting device is used as a light source for POF communication, the low loss wavelength range of the POF is as small as around 40 nm, so that the peak wavelength in the emission spectrum of the semiconductor light emitting device is required to be set within the low loss wavelength range without displacement. In other words, the distance between the upper surface of the DBR and the lower surface of the active layer should be set with high accuracy. Accordingly, in the process of manufacturing semiconductor light emitting devices, a clad layer and the like placed in between a DBR and a quantum well active layer requires high-accuracy layer thickness control in particular. This leads to a problem of decrease in a yield of the semiconductor light emitting devices.

SUMMARY OF THE INVENTION

Accordingly, it is an object of the present invention to provide a semiconductor light emitting device which is not affected by variance in a distance between an upper surface of a DBR and a lower surface of an active layer, and enables stable provision of a specified peak wavelength in an emission spectrum.

To accomplish the above object, a first aspect of the present invention provides a semiconductor light emitting device having in sequence on a semiconductor substrate, a multilayer reflection film, a semiconductor layer, and a quantum well active layer, wherein when a light emission wavelength is λ ($\mu$m), and an average refractive index of the semiconductor layer disposed in between the multilayer reflection film and the quantum well active layer is n, a distance between an upper surface of the multilayer reflection film and a lower surface of the quantum well active layer is 2λ/n ($\mu$m) or less, and a phase difference between a reflected ray of light reflected by the multilayer reflection film and an emitted ray of light from the quantum well active layer is a multiple of 2π.

According to the first aspect of the semiconductor light emitting device, the distance between the upper surface of the multilayer reflection film and the lower surface of the quantum well active layer is set to be 2λ/n or less, and a phase difference between a reflected ray of light reflected by the multilayer reflection film and an emitted ray of light from the quantum well active layer is set to be a multiple of 2π. As a result, in the emission spectrum configuration of the semiconductor light emitting device, an interval between troughs generated by interference between the reflected ray of light and the emitted ray of light becomes relatively large. Accordingly, even if the distance between the upper surface of the multilayer reflection film and the lower surface of the quantum well active layer is slightly changed and therefore the position of troughs in the emission spectrum configuration is slightly displaced, the troughs will not match peaks. Therefore, with slight variance in the distance between the upper surface of the multilayer reflection film and the lower surface of the quantum well active layer, there is almost no difference in a peak wavelength of the semiconductor light emitting device. This enables stable provision of the semiconductor light emitting device having a specified peak wavelength without a necessity of high-accuracy thickness control.

A second aspect of the present invention provides a semiconductor light emitting device having in sequence on a semiconductor substrate, a multilayer reflection film, a semiconductor layer, and a quantum well active layer, wherein when a light emission wavelength is $\lambda$ ($\mu$m), and an average refractive index of the semiconductor layer disposed in between the multilayer reflection film and the quantum well active layer is n, a distance between an upper surface of the multilayer reflection film and a lower surface of the quantum well active layer is 15$\lambda$/n ($\mu$m) or more.

According to the second aspect of the present invention, in the emission spectrum configuration of the semiconductor light emitting device, an interval between troughs generated by interference between the reflected ray of light reflected by the multilayer reflection film and the emitted ray of light from the active layer becomes small. For example, when an average refractive index n of the semiconductor layer equals to 3.0, and an emission wavelength $\lambda$ of the semiconductor light emitting device equals to 0.65 $\mu$m, the distance between the upper surface of the multilayer reflection film and the lower surface of the quantum well active layer is about 3 $\mu$m based on 15$\lambda$/n. In this case, as seen from FIG. 8, the interval between troughs generated by interference between a reflected ray of light reflected by the multilayer reflection film and an emitted ray of light from the active layer becomes approximately 15 nm. FIG. 8 is a view showing, in the semiconductor light emitting device in which an average refractive index n of the semiconductor layer in between the multilayer reflection film and the quantum well active layer equals to 3.0, and an emission wavelength $\lambda$ equals to 0.65 $\mu$m, an interval between the troughs of interference corresponding to a distance between the upper surface of the multilayer reflection film and the lower surface of the quantum well active layer. A horizontal axis represents a distance between the upper surface of the multilayer reflection film and the lower surface of the quantum well active layer ($\mu$m), while a vertical axis represents an S interval between troughs of interference (nm). As seen from FIG. 8, when the distance between the upper surface of the multilayer reflection film and the lower surface of the quantum well active layer equals to 3 $\mu$m or more, the interval between troughs of interference becomes less than 15 nm. Consequently, a ray of light emitted from the semiconductor light emitting device has at least one peak wavelength in a wavelength range of 16 nm. Therefore, the semiconductor light emitting device is suitable as a light source of the POF for IEEE 1394 which requires control of a peak wavelength of a ray of light emitted at a room temperature to be approximately 16 nm or less. Further, with larger distance between the upper surface of the multilayer reflection film and the lower surface of the quantum well active layer, the emission spectrum configuration acquires a number of plural peaks and troughs compared to the case of no interference. However, the configuration of an envelope curve obtained by connecting these plural peaks stays about the same as the configuration of a spectrum without interference. In addition, if the distance between the upper surface of the multilayer reflection film and the lower surface of the quantum well active layer is slightly varied, and the number of the plural peaks and troughs in the emission spectrum configuration is changed, or the troughs of interference match peaks in the emission spectrum in the case of no interference, the configuration of an envelope curve in the emission spectrum shows almost no difference from the configuration of the emission spectrum in the case of no interference. In other words, the semiconductor light emitting device is almost free from change in the peak wavelength. This enables stable provision of the semiconductor light emitting device having a specified peak wavelength without a necessity of high-accuracy thickness control.

In one embodiment of the present invention, the semiconductor substrate is composed of GaAs, InP, ZnSe, or GaN.

According to the embodiment, luminous efficiency of the semiconductor light emitting device is increased by forming, on the semiconductor substrate, a semiconductor layer and an active layer made of a semiconductor which is lattice-matched with GaAs, InP, ZnSe, or GaN.

In one embodiment of the present invention, a distance between an upper surface of the multilayer reflection film and a lower surface of the quantum well active layer is 0.4 $\mu$m or less.

When the distance between the upper surface of the multilayer reflection film and the lower surface of the quantum well active layer is set to be 0.4 $\mu$m or less, and the semiconductor layer disposed in between the multilayer reflection film and the quantum well active layer is made from a material that is lattice-matched with a GaAs substrate such as $Al_yGa_zIn_{1-y-z}P$ (Aluminum Indium Phosphide) ($0 \leq y \leq 1$, $0 \leq z \leq 1$), and $Al_xGa_{1-x}As$ (Aluminum Gallium Arsenide) ($0 \leq x \leq 1$), each having a refractive index of 3 to 3.5, a peak wavelength of the semiconductor light emitting device is sustained around 650 nm. This enables stable provision of the semiconductor light emitting device suitable, for example, as a light source of a POF without a necessity of high-accuracy thickness control.

In one embodiment of the present invention, a distance between an upper surface of the multilayer reflection film and a lower surface of the quantum well active layer is 3 $\mu$m or more.

When the distance between the upper surface of the multilayer reflection film and the lower surface of the quantum well active layer is set to be 3 $\mu$m or more, and the semiconductor layer disposed in between the multilayer reflection film and the quantum well active layer is made from a material that is lattice-matched with a GaAs substrate such as $Al_yGa_zIn_{1-y-z}P$ ($0 \leq y \leq 1$, $0 \leq z \leq 1$), and $Al_xGa_{1-x}As$ ($0 \leq x \leq 1$), each having a refractive index of 3 to 3.5, a peak wavelength of the semiconductor light emitting device is sustained around 650 nm. This enables stable provision of the semiconductor light emitting device suitable, for example, as a light source of a POF without a necessity of high-accuracy thickness control.

In one embodiment of the present invention, the quantum well active layer having a quantum well active layer is composed of $Al_yGa_zIn_{1-y-z}P$ ($0 \leq y \leq 1$, $0 \leq z \leq 1$).

According to the embodiment, the quantum well active layer is composed of $Al_yGa_zIn_{1-y-z}P$ ($0 \leq y \leq 1$, $0 \leq z \leq 1$). This enables provision of the semiconductor light emitting device having a desired wavelength in the wavelength range of luminescent colors from red to green.

In one embodiment of the present invention, the multilayer reflection film is composed of a material that is lattice-matched with GaAs.

This increases crystallinity of an active layer formed on the multilayer reflection film, and facilitates mirror-finish processing of an interface between the multilayer reflection film and a layer on top thereof, resulting in increased reflectance of the multilayer reflection film. As a result, the semiconductor light emitting device obtains higher output.

In one embodiment of the present invention, the multilayer reflection film is composed of $Al_yGa_zIn_{1-y-z}P$ ($0 \leq y \leq 1$, $0 \leq z \leq 1$).

According to the embodiment, $Al_yGa_zIn_{1-y-z}P$ forming the multilayer reflection film is lattice-matched with a GaAs substrate. This increases crystallinity of an active layer formed on the multilayer reflection film, and facilitates mirror-finish processing of an interface between the multilayer reflection film and a layer on top thereof, resulting in increased reflectance of the multilayer reflection film. As a result, the semiconductor light emitting device obtains higher output.

In one embodiment of the present invention, the multilayer reflection film is composed of $Al_xGa_{1-x}As$ ($0.4 \leq x \leq 1$).

According to the embodiment of the present invention, $Al_xGa_{1-x}As$ ($0.4 \leq x \leq 1$) forming the multilayer reflection film is lattice-matched with a GaAs substrate. This increases crystallinity of an active layer formed on the multilayer reflection film, and facilitates mirror-finish processing of an interface between the multilayer reflection film and a layer on top thereof, resulting in increased reflectance of the multilayer reflection film. As a result, the semiconductor light emitting device obtains higher output. In addition, a multilayer reflection film composed of $Al_xGa_{1-x}As$ ($0.4 \leq x \leq 1$) has higher reflectance against rays of light having a wavelength from red to yellow than a multilayer reflection film composed of $Al_yGa_zIn_{1-y-z}P$ ($0 \leq y \leq 1$, $0 \leq z \leq 1$). This enables provision of the semiconductor light emitting device having high output, which emits rays of light having a color from red to yellow.

In one embodiment of the present invention, the multilayer reflection film is composed of a pair of $Al_yGa_zIn_{1-y-z}P$ ($0 \leq y \leq 1$, $0 \leq z \leq 1$) and $Al_xGa_{1-x}As$ ($0.4 \leq x \leq 1$).

According to embodiment of the present invention, $Al_yGa_zIn_{1-y-z}P$ ($0 \leq y \leq 1$, $0 \leq z \leq 1$) and $Al_xGa_{1-x}As$ ($0.4 \leq x \leq 1$) which form the multilayer reflection film are lattice-matched with a GaAs substrate. This increases crystallinity of an active layer formed on the multilayer reflection film, and facilitates mirror-finish processing of an interface between the multilayer reflection film and a layer on top thereof, resulting in increased reflectance of the multilayer reflection film. As a result, the semiconductor light emitting device obtains higher output.

In one embodiment of the present invention, a maximum reflectance of the multilayer reflection film against a ray of light from the quantum well active layer is 80% or more.

This increase output of the semiconductor light emitting device.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Embodiments of the present invention will be hereinbelow described in detail with reference to drawings.

Figure 1A:
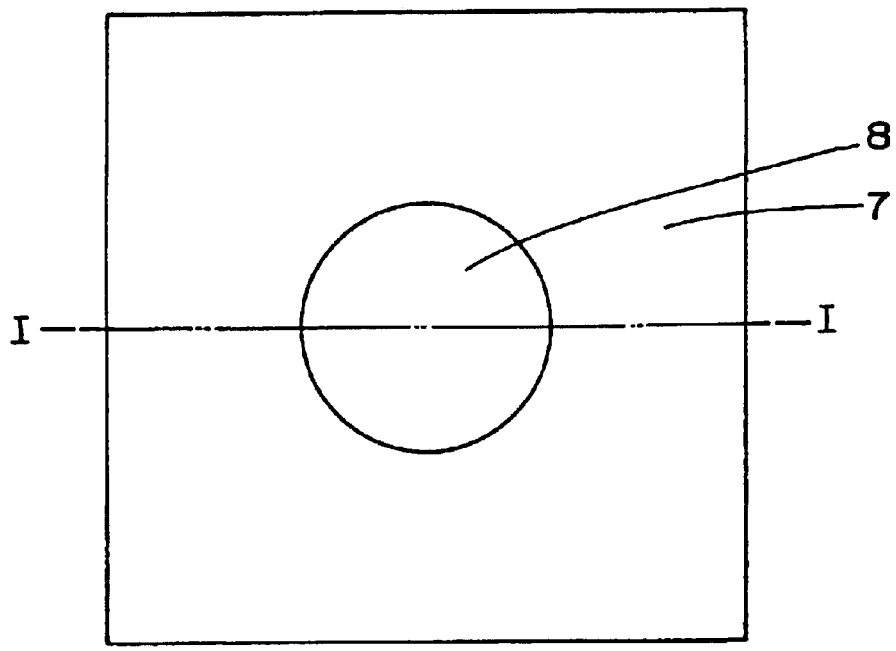
FIG. 1A is a plane view showing a semiconductor light emitting device in a first embodiment of the present invention.
Figure 1B:
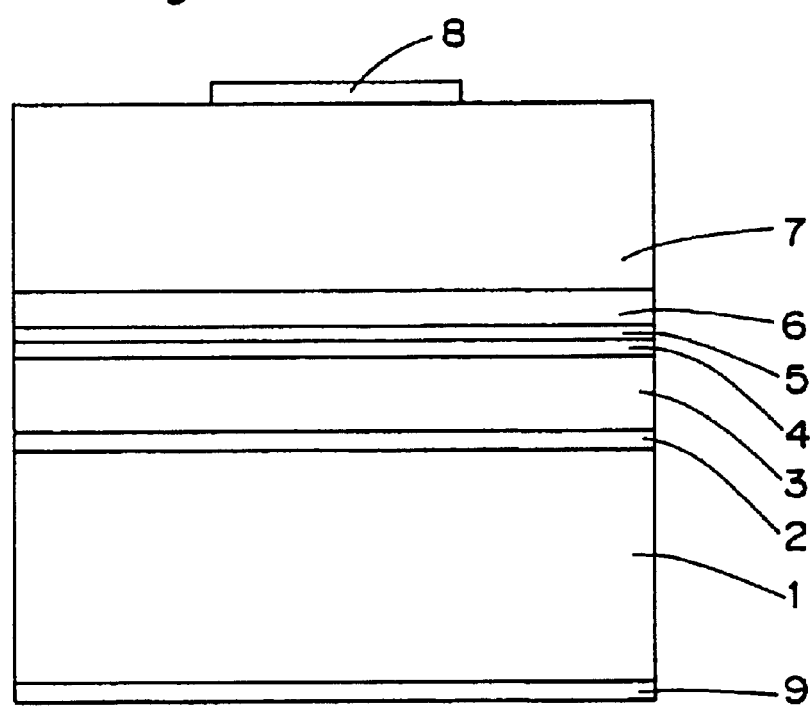
FIG. 1B is a cross sectional view taken along lines I—I of FIG. 1A.

FIG. 1A is a plane view showing a semiconductor light emitting device in a first embodiment of the present invention, while FIG. 1B is a cross sectional view taken along lines I—I of FIG. 1A.

The semiconductor light emitting device is a surface-emitting AlGaInP based LED for use as a light source of POF. The semiconductor light emitting device has in sequence, on an n-type GaAs substrate 1, an n-type GaAs buffer layer 2, a DBR (Distributed Bragg Reflector) 3 as a multilayer reflection film, an n-type AlInP first clad layer 4, a quantum well active layer 5, a p-type AlInP second clad layer 6, and a p-type AlGaAs current diffusion layer 7. On the upper surface of the current diffusion layer 7, a p-type electrode 8 is provided, whereas on the lower surface of the n-type GaAs substrate 1, an n-type electrode 9 is provided.

The quantum well active layer 5 is made up of two GaInP well layers having a thickness of 80 angstroms, and an $(Al_{0.5}Ga_{0.5})_{0.5}In_{0.5}P$ barrier layer provided in between the two well layers and on an upper side of the upper well layer and a lower side of the lower well layer. An emitted ray of light from the quantum well active layer 5 has a peak wavelength of 650 nm. The DBR 3 is made up of 20 pairs of N-type $Al_{0.5}In_{0.5}P$ and n-type $(Al_{0.2}Ga_{0.8})_{0.5}In_{0.5}P$ laminated. The central wavelength of a reflectance spectrum by the DBR 3 is 650 nm. In addition, the n-type AlInP first clad layer 4 has a layer thickness of 0.3 μm. This layer thickness is less than $2\lambda/n$ (μm) where k is an emission wavelength (μm) of the semiconductor light emitting device and n is a refractive index of the first clad layer. 4. More specifically, The layer thickness is less than 0.4 μm which is obtained by substituting 650 nm i.e. 0.65 μm for λ and 3 for n in $2\lambda/n$ (μm). The n-type AlInP first clad layer 4 is so formed that a phase difference between an emitted ray of light from the quantum well active layer 5 and a reflected ray of light reflected by the DBR 3 becomes a multiple of $2\pi$.

The semiconductor light emitting device is manufactured in the following procedures. First, on an n-type GaAs substrate 1 inclined by 15° from a plane (100) in [011] direction, an n-type GaAs buffer layer 2 is laminated so as to have a thickness of 1 μm. Next, a DBR 3 is formed by laminating 20 pairs of N-type $Al_{0.5}In_{0.5}P$ and n-type $(Al_{0.2}Ga_{0.8})_{0.5}In_{0.5}P$. Then, an n-type AlInP first clad layer 4 is formed so as to have a thickness of 0.3 μm. After that, there are laminated in sequence an $(Al_{0.5}Ga_{0.5})_{0.5}In_{0.5}P$ barrier layer, a GaInP well layer having a thickness of 80 angstroms, an $(Al_{0.5}Ga_{0.5})_{0.5}In_{0.5}P$ barrier layer, and again a GaInP well layer having a thickness of 80 angstroms, and an $(Al_{0.5}Ga_{0.5})_{0.5}In_{0.5}P$ barrier layer, to form a quantum well active layer 5. Next, after a p-type $Al_{0.5}In_{0.5}P$ second clad layer 6 is formed to have a thickness of 1 μm, a p-type $Al_{0.5}Ga_{0.5}$. As current diffusion layer 7 is laminated to have a thickness of 7 μm. All the semiconductor layers stated above are laminated by MOCVD (metal-organic chemical vapor deposition) process. After that, an AuZn/Mo/Au layer is formed on the p-type $Al_{0.5}Ga_{0.5}As$ current diffusion layer 7 by sputtering, and then heated to provide a p-type electrode 8. The n-type GaAs substrate 1 is polished to have a thickness of approximately 280 μm. On the entire lower surface of the n-type GaAs substrate 1, AuGe/Au is deposited and then heated to form an n-type electrode 9.

Figure 2:
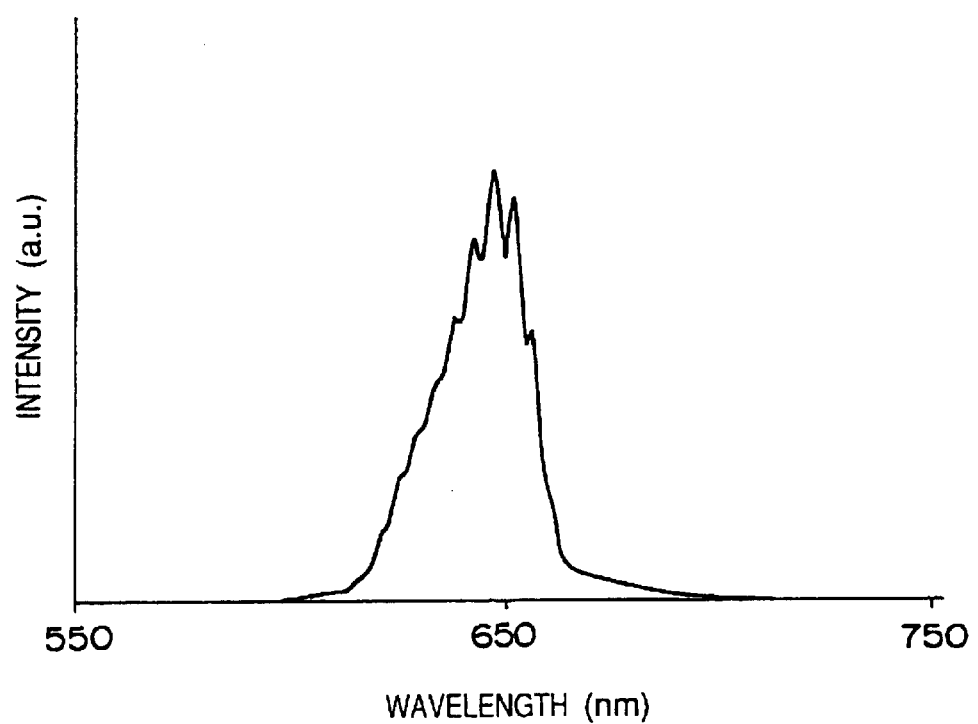
FIG. 2 is a view showing an emission spectrum of the semiconductor light emitting device shown in FIGS. 1A and 1B.

Thus-obtained semiconductor light emitting device emits red light, having an emission spectrum as shown in FIG. 2. In FIG. 2, a horizontal axis represents a wavelength of light (nm), while a vertical axis represents relative intensity of light (a.u.) The clad layer 4 of the semiconductor light emitting device is so formed that a phase difference between a reflected ray of light reflected by the DBR 3 and an emitted ray of light from the active layer 5 becomes a multiple of $2\pi$. As shown in FIG. 2, therefore, the emission spectrum of the semiconductor light emitting device has only a main peak with a wavelength of 650 nm and no sub peaks are present in the both sides of the main peak. In addition, a distance between the upper surface of the DBR 3 and the lower surface of the quantum well active layer 5 of the semiconductor light emitting device, that is, a thickness of the n-type first clad layer 4 is 0.3 μm less than $2\lambda/n$ μm i.e. 0.4 μm (λ: wavelength of light (μm), n: refractive index of the clad layer 4). Accordingly, in the emission spectrum of the semiconductor light emitting device, an interval between troughs generated by interference between a reflected ray of light reflected by the DBR 3 and an emitted light from the active layer 5 is 50 to 60 nm. The interval between the troughs is 1.5 to 2 times larger than that in the emission spectrum of a semiconductor light emitting device having an n-type clad layer with a thickness of about 1 μm. Therefore, in the semiconductor light emitting device of FIGS. 1A and 1B, even if a slight variance is present in the thickness of the n-type first clad layer 4 in the manufacturing process, troughs generated by the interference in the emission spectrum do not match a main peak. Consequently, a peak wavelength of the semiconductor light emitting device will not change. Thereby, a semiconductor light emitting device having an approximately constant peak wavelength can be obtained without a necessity of high-accuracy thickness control. Further, the DBR 3 has 20 pairs of N-type $Al_{0.5}In_{0.5}P$ and n-type $(Al_{0.2}Ga_{0.8})_{0.5}In_{0.5}P$, which provides the DBR 3 with about 90% of peak reflectance against incident rays of light to the DBR 3. As a result, the semiconductor light emitting device can obtain output of 1.0 mW in a current having 20 mA of initial optical output. In addition, the semiconductor light emitting device was subjected to an electrifying test with a current of 50 mA in an ambient having a temperature of 80° C. and humidity of 85%. The test result indicated that 90% of an initial optical output was maintained after 1000 hours, proving excellent durability of the semiconductor light emitting device. There was also produced a semiconductor light emitting device whose DBR 3 was formed by laminating 20 pairs of N-type $Al_{0.5}In_{0.5}P$ and n-type $Al_{0.5}Ga_{0.5}As$. The result provided the same optical output and reliability as the case of the semiconductor light emitting device having a DBR formed with pairs of $Al_{0.5}In_{0.5}P$ and $(Al_{0.2}Ga_{0.8})_{0.5}In_{0.5}P$.

Figure 3A:
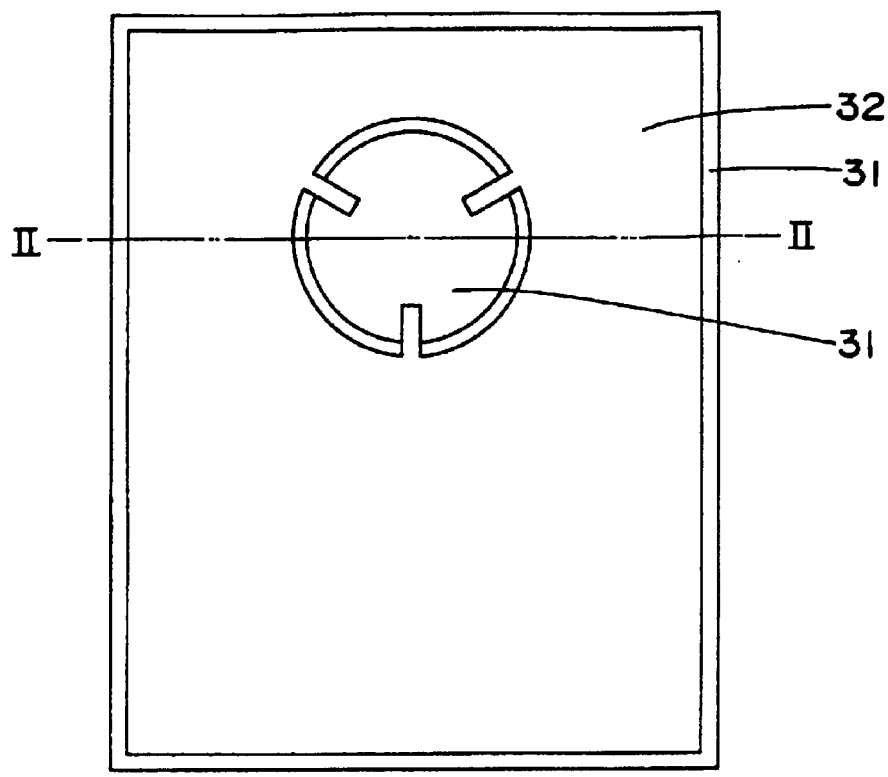
FIG. 3A is a plane view showing a semiconductor light emitting device in a second embodiment of the present invention.
Figure 3B:
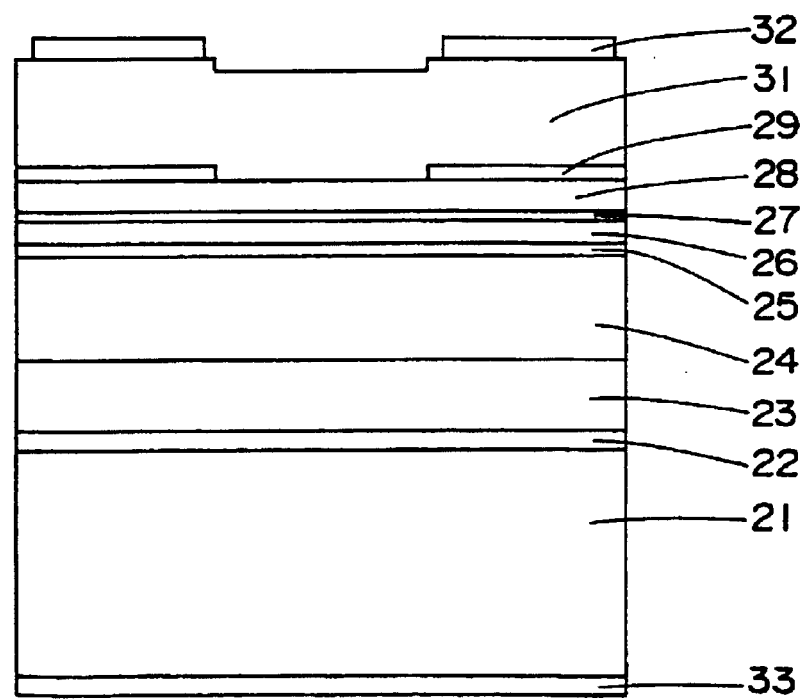
FIG. 3B is a cross sectional view taken along lines II—II of FIG. 3A.

FIG. 3A is a plane view showing a semiconductor light emitting device in a second embodiment of the present invention, while FIG. 3B is a cross sectional view taken along a line II—II of FIG. 3A.

The semiconductor light emitting device is a surface-emitting AlGaInP based LED. The semiconductor light emitting device has in sequence, on an n-type GaAs substrate 21, an n-type GaAs buffer layer 22, a DBR (Distributed Bragg Reflector) 23 as a multilayer reflection film, an n-type AlInP first clad layer 24, a quantum well active layer 25, a p-type AlInP second clad layer 26, a p-type AlGaInP intermediate layer 27, a p-type AlGaInP first current diffusion layer 28, an n-type AlGaInP current narrowing layer 29, and a p-type AlGaInP second current diffusion layer 31. On the upper surface of the second current diffusion layer 31, a p-type electrode 32 is provided, whereas on the lower surface of the n-type GaAs substrate 21, an n-type electrode 33 is provided.

The quantum well active layer 25 is made up of one GaInP well layer having a thickness of 80 angstroms, and an $(Al_{0.5}Ga_{0.5})_{0.5}In_{0.5}P$ barrier layer provided on both upper and lower sides of the well layer. A emitted rays of light from the quantum well active layer 25 has a peak wavelength of 665 nm. The DBR 23 is made up of 20 pairs of n-type AlAs and n-type $Al_{0.5}Ga_{0.5}As$ laminated. The central wavelength of a reflectance spectrum by the DBR 23 is 665 nm. In addition, the first clad layer 24 of n-type $Al_{0.5}In_{0.5}P$ has a layer thickness of 7 μm. This layer thickness is larger than $15\lambda/n$ (μm), where λ is an emission wavelength (μm) of the semiconductor light emitting device and n is a refractive index of the first clad layer 24. More specifically, the layer thickness is larger than 3 μm which is obtained by substituting 665 nm i.e. 0.665 μm for λ and 3 for n in $15\lambda/n$ (μm).

Figure 4:
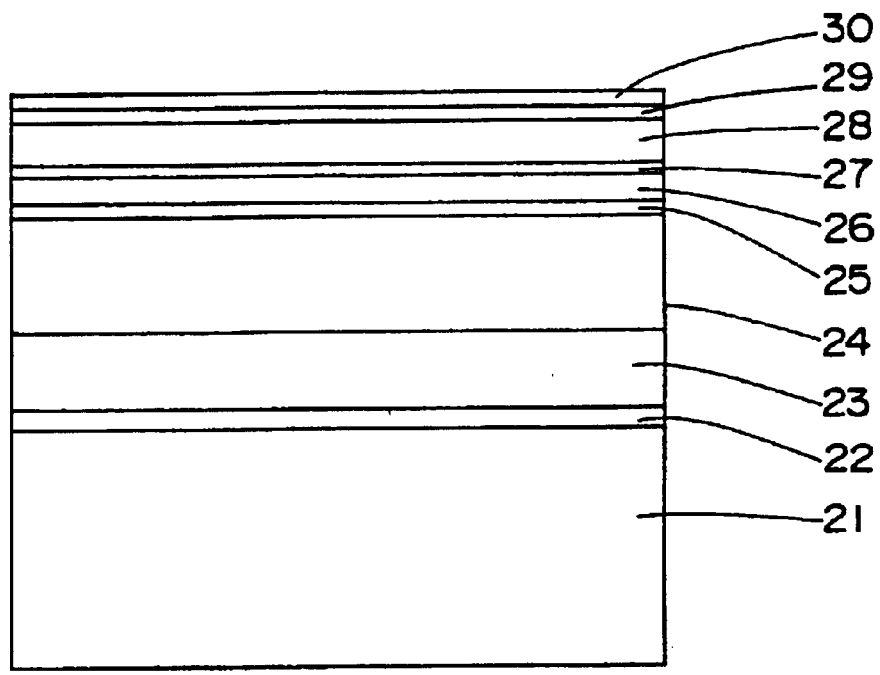
FIG. 4 is a view showing a state in the process of manufacturing the semiconductor light emitting device shown in FIGS. 3A and 3B, where semiconductor layers up to a cap layer are laminated.
Figure 5A:
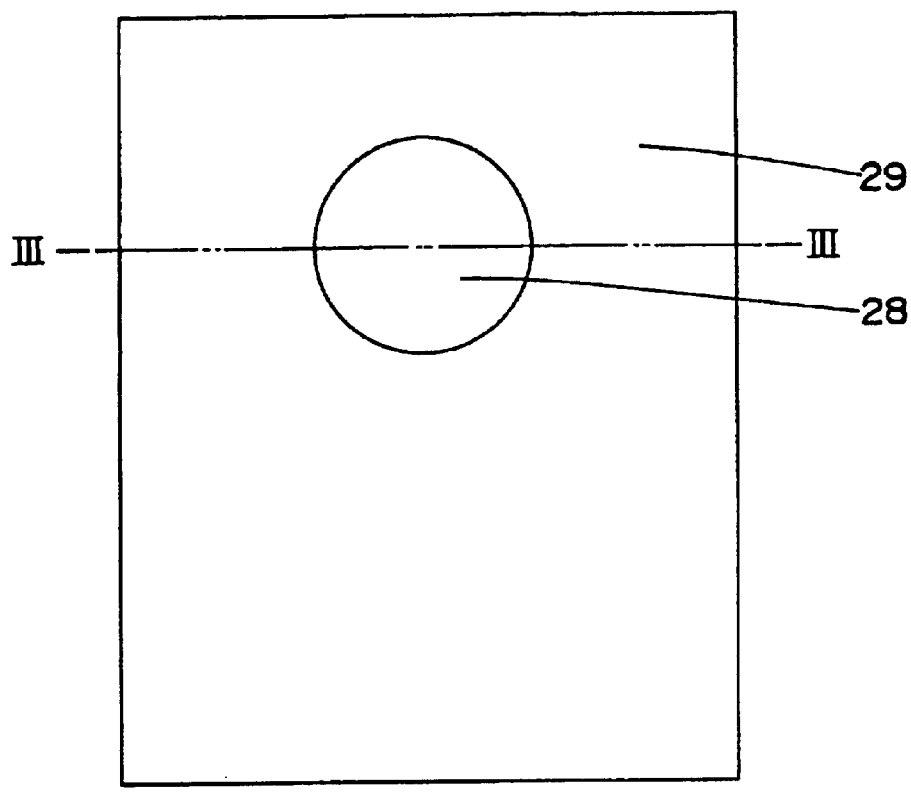
FIG. 5A is a plane view showing the semiconductor light emitting device shown in FIGS. 3A and 3B when a current narrowing layer is patterned thereon in the manufacturing process thereof.
Figure 5B:
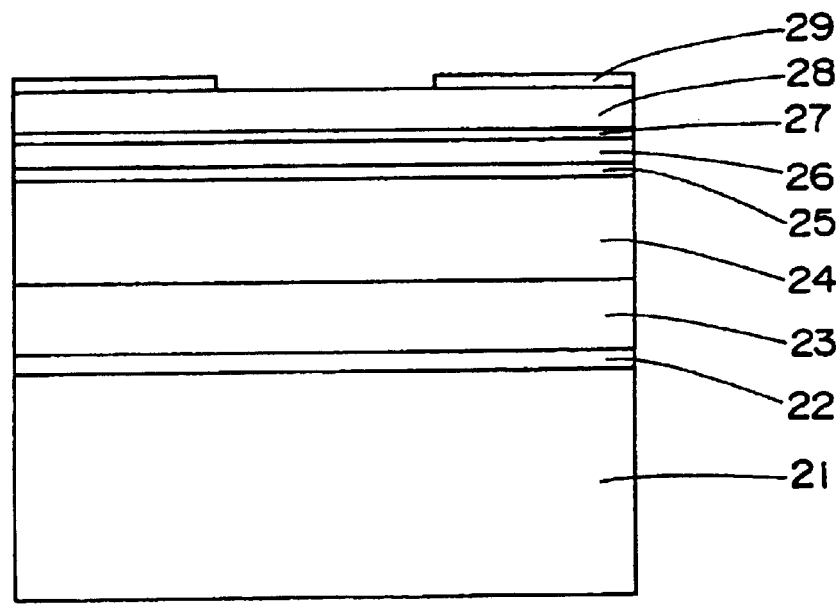
FIG. 5B is a cross sectional view taken along lines III—III of FIG. 5A.
Figure 6:
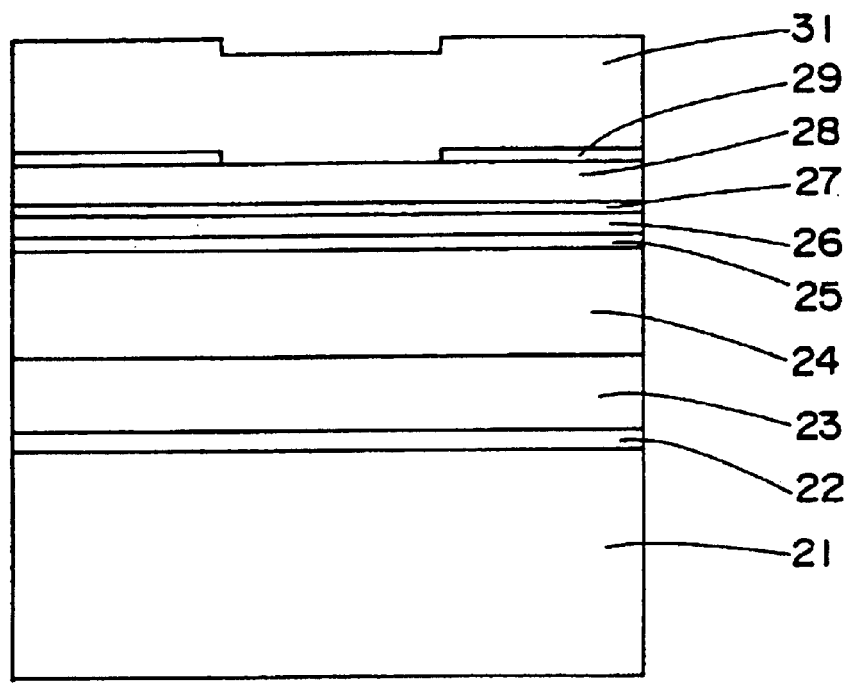
FIG. 6 is a cross sectional view showing the semiconductor light emitting device shown in FIGS. 3A and 3B when a second current diffusion layer is formed in the manufacturing process thereof.

The semiconductor light emitting device is manufactured in the following procedures. FIG. 4 is a cross sectional view showing one process of manufacturing the semiconductor light emitting device. FIG. 5A is a plane view showing a process other than the process shown in FIG. 4. FIG. 5B is a cross sectional view taken along a line III—III of FIG. 5A. FIG. 6 is a cross sectional view showing a process other than the processes shown in FIG. 4, FIG. 5A, and FIG. 5B. First, as shown in FIG. 4, on an n-type GaAs substrate 21 inclined by 15° from a plane (100) in [011] direction, an n-type GaAs buffer layer 22 is laminated so as to have a thickness of 1 μm. Next, a DBR 23 is formed by laminating 20 pairs of n-type AlAs and n-type $Al_{0.5}Ga_{0.5}As$. Then, an n-type $Al_{0.5}In_{0.5}P$ first clad layer 24 is formed so as to have a thickness of 7 μm. After that, there are laminated in sequence an $(Al_{0.5}Ga_{0.5})_{0.5}In_{0.5}P$ barrier layer, a GaInP well layer having a thickness of 80 angstroms, and an $(Al_{0.5}Ga_{0.5})_{0.5}In_{0.5}P$ barrier layer to form a quantum well active layer 25. Next, after a p-type $Al_{0.5}In_{0.5}P$ second clad layer 26 is formed to have a thickness of 1 μm, a p-type AlGaInP intermediate layer 27 is laminated to have a thickness of 0.15 μm. Further on top thereof, a p-type AlGaInP first current diffusion layer 28 is laminated to have a thickness of 1 μm, and then an n-type AlGaInP current narrowing layer 29 is further laminated to have a thickness of 0.3 μm, On top of the n-type AlGaInP current narrowing layer 29, an n-type GaAs cap layer 30 having a thickness of 0.01 μm is laminated. All the semiconductor layers stated above are laminated by MOCVD (metal-organic chemical vapor deposition) process.

Then, as shown in the plane view of FIG. 5A and the cross sectional view of FIG. 5B, the n-type GaAs cap layer 30 is removed with sulfuric acid/hydrogen peroxide etchant. After that, part of the n-type AlGaInP current narrowing layer 29 is removed by photolithography and etching through use of sulfuric acid/hydrogen peroxide etchant till the p-type first current diffusion layer 28 is exposed, by which a round-shaped current path with a diameter of approximately. 70 μm is formed.

After the current path is formed on the n-type current narrowing layer 29, a p-type AlGaInP second current diffusion layer 31 is generated to have a thickness of 7 μm on the p-type first current diffusion layer 28 and the n-type current narrowing layer 29, as shown in the cross sectional view of FIG. 6.

Then, AuBe/Au is deposited on the p-type second current diffusion layer 31, and photolithography and etching through use of Au etchant are applied to the AuBe/Au to form a surface electrode. After that, the surface electrode is heated to provide a p-type electrode 32 shown in FIGS. 3A and 3B. Further, the n-type GaAs substrate 21 is polished to have a thickness of approximately 280 μm. On the entire lower surface of the n-type GaAs substrate 21, AuGe/Au is deposited and then heated to form an n-type electrode 33.

Figure 7:
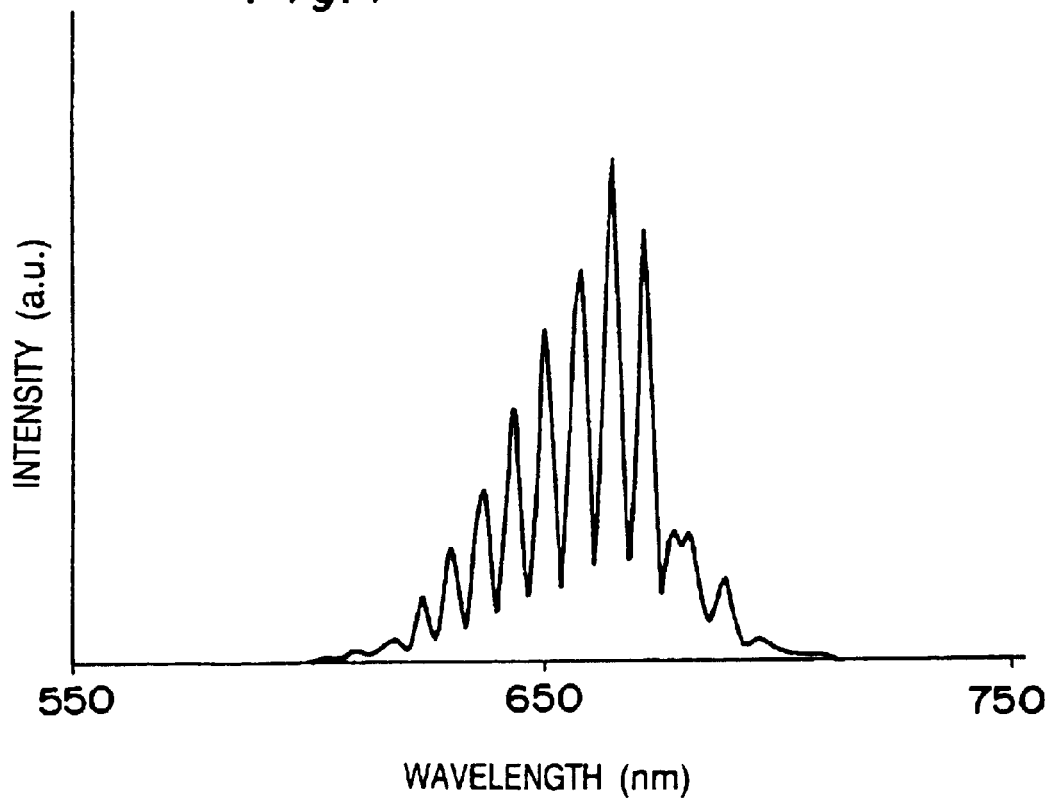
FIG. 7 is a view showing an emission spectrum of the semiconductor light emitting device shown in FIGS. 3A and 3B.
Figure 8:
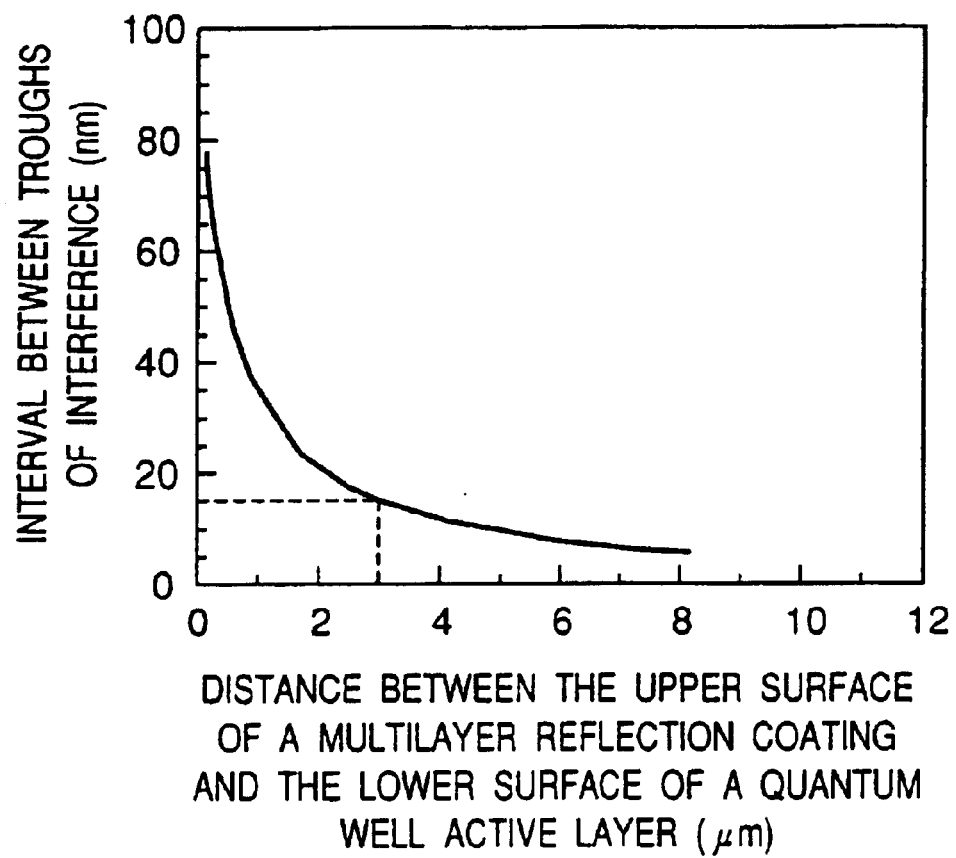
FIG. 8 is a view showing an interval between troughs generated by interference between an emitted lay of light from a quantum well active layer and a reflected ray of light reflected by a multilayer reflection film, corresponding to a distance between an upper surface of the multilayer reflection film and a lower surface of the quantum well active layer.
Figure 9:
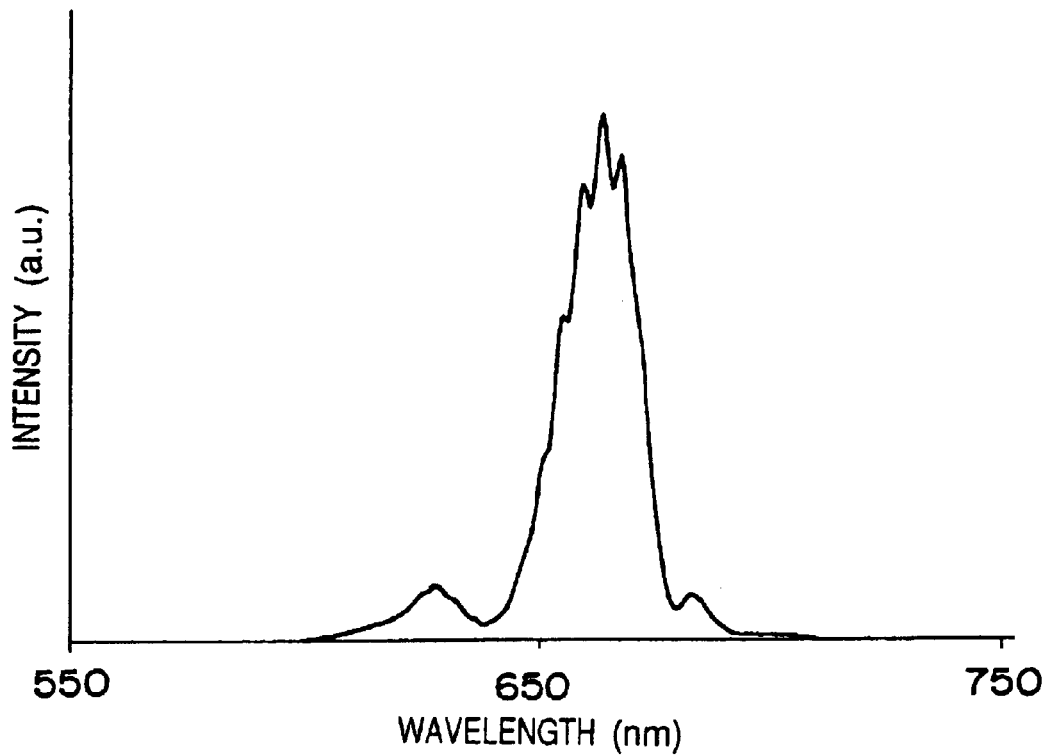
FIG. 9 is a view showing an emission spectrum of a prior art semiconductor light emitting device.
Figure 10:
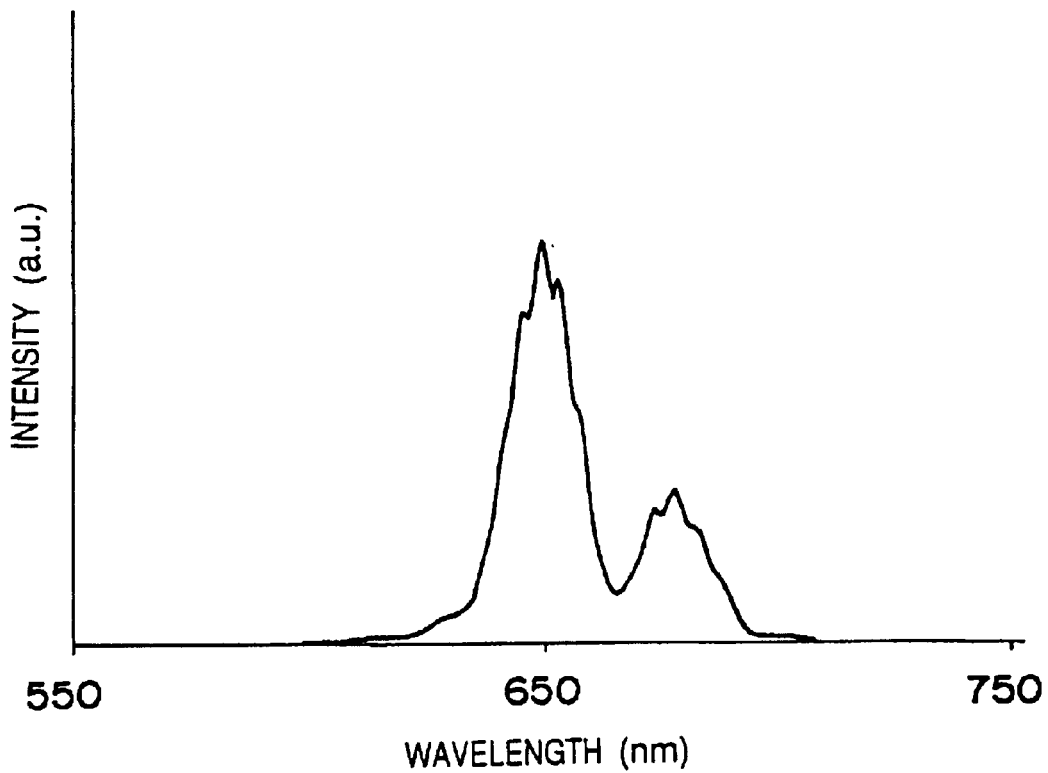
FIG. 10 is a view showing an emission spectrum of the semiconductor light emitting device having the emission spectrum shown in FIG. 9, in which a distance between the upper surface of the multilayer reflection film (DBR) and the lower surface of the quantum well active layer is increased by a few percents.

Thus-obtained semiconductor light emitting device emits red light, having an emission spectrum as shown in FIG. 7. In FIG. 7, a horizontal axis represents a wavelength of light (nm) while a vertical axis represents relative intensity of light (a.u.). In this semiconductor light emitting device, the distance between the upper surface of the DBR 23 and the lower surface of the quantum well active layer 25, that is, the thickness of the n-type first clad layer 24 is 7 μm more than 15λ/n μm i.e. 3 μm (λ: wavelength of light (μm), n: refractive index of the clad layer 24). Accordingly, in the emission spectrum of the semiconductor light emitting device, an interval between troughs generated by interference between a reflected ray of light reflected by the DBR 23 and an emitted light from the active layer 25 is around 7 nm. As a result, as shown in FIG. 7, the emission spectrum configuration shows a plurality of peaks and troughs by interference. However, the configuration of an envelope curve obtained by connecting these peaks is about the same as the configuration of the emission spectrum in the case of no interference. Therefore, there is almost no difference between the peak wavelength of the envelope curve in the emission spectrum with interference and the peak wavelength in the emission spectrum without interference. Further, even if a trough caused by interference in the emission spectrum matches a main peak in the case of no interference, there is almost no difference between the peak wavelengths. This is because a peak next to the trough that matches the main peak in the case of no interference becomes a main peak in the envelope curve, where an interval between the trough and the peak is about 3.5 nm in wavelength, so that the main peak in the envelope curve is longer or shorter by approximately 3.5 nm than the peak wavelength in the case of no interference. Accordingly, even if a trough caused by interference matches the main peak in the case of no interference, the peak wavelength of the envelope curve hardly changes from the peak wavelength in the case of no interference. As a result, the semiconductor light emitting device of FIGS. 3A and 3B has almost an uniform peak wavelength even with slight variance in the thickness of the n-type first clad layer 24 in the manufacturing process. Therefore, the semiconductor light emitting device enables to provide an approximately constant peak wavelength without a necessity of high-accuracy thickness control. Further, the DBR 23 is formed by laminating 20 pairs of n-type AlAs and n-type $Al_{0.5}Ga_{0.5}As$, which provides the DBR 23 with 95% or more of peak reflectance against incident rays of light to the DBR 23. As a result, the semiconductor light emitting device can obtain high output. Further, with inner quantum efficiency improved by the current narrowing layer 29, the semiconductor light emitting device can obtain output as high as 2.2 mW in a current of 20 mA. In addition, the semiconductor light emitting device was subjected to an electrifying test with a current of 50 mA in an ambient having a temperature of 80° C. and humidity of 85%. The result of the test indicated that 90% of an initial optical output was maintained after 1000 hours, proving excellent durability of the semiconductor light emitting device.

Although the semiconductor light emitting device in the above-stated embodiments is an AlGaInP based semiconductor light emitting device formed on a GaAs substrate, the present invention is also applicable to semiconductor light emitting devices other than the AlGaInP based semiconductor light emitting device. According to the present invention, the same functions and effects as the semiconductor light emitting device of the above embodiments are implemented in other semiconductor light emitting devices than the AlGaInP based semiconductor light emitting device such as InGaAsP based, ZnSe based, and GaN based semiconductor light emitting devices formed on the substrates other than the GaAs substrate such as InP substrates, ZnSe substrates, and GaN substrates.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A semiconductor light emitting device having in sequence on a semiconductor substrate, a multilayer reflection film, a semiconductor layer, and a quantum well active layer, wherein when a light emission wavelength is λ(μm), and an average refractive index of the semiconductor layer disposed in between the multilayer reflection film and the quantum well active layer is n, a distance between an upper surface of the multilayer reflection film and a lower surface of the quantum well active layer is 2λ/n (μm) or less, and a phase difference between a reflected ray of light reflected by the multilayer reflection film and an emitted ray of light from the quantum well active layer is a multiple of 2π.

2. The semiconductor light emitting device as defined in claim 1, wherein the semiconductor substrate is composed of GaAs, InP, ZnSe, or GaN.

3. The semiconductor light emitting device as defined in claim 1, wherein a distance between an upper surface of the multilayer reflection film and a lower surface of the quantum well active layer is 0.4 µm or less.

4. The semiconductor light emitting device as defined in claim 1, wherein the quantum well active layer having a quantum well active layer is composed of $Al_yGa_zIn_{1-y-z}P$ ($0 \leq y \leq 1, 0 \leq z \leq 1$).

5. The semiconductor light emitting device as defined in claim 1, wherein the multilayer reflection film is composed of a material that is lattice-matched with GaAs.

6. The semiconductor light emitting device as defined in claim 1, wherein the multilayer reflection film is composed of $Al_yGa_zIn_{1-y-z}P$($0 \leq y \leq 1, 0 \leq z \leq 1$).

7. The semiconductor light emitting device as defined in claim 1, wherein the multilayer reflection film is composed of $Al_xGa_{1-x}As(0.4 \leq x \leq 1)$.

8. The semiconductor light emitting device as defined in claim 1, wherein the multilayer reflection film is composed of a pair of $Al_yGa_zIn_{1-y-z}P(0 \leq y \leq 1, 0 \leq z \leq 1)$ and $Al_xGa_{1-x}As(0.4 \leq x \leq 1)$.

9. The semiconductor light emitting device as defined in claim 1, wherein a maximum reflectance of the multilayer reflection film against a ray of light from the quantum well active layer is 80% or more.

10. A semiconductor light emitting device comprising:

a semiconductor substrate supporting a multilayer reflection film, a semiconductor layer, and a quantum well active layer, wherein, when a light emission wavelength is λ (µm), and an average refractive index of the semiconductor layer disposed between the multilayer reflection film and the quantum well active layer is n, a distance between an upper surface of the multilayer reflection film and a lower surface of the quantum well active layer is 2λ/n (µm) or less, and a phase difference between a reflected ray of light reflected by the multilayer reflection film and an emitted ray of light from the quantum well active layer is a multiple of 2π.

11. The semiconductor light emitting device of claim 10, wherein the semiconductor substrate is composed of GaAs, InP, ZnSe, or GaN.

12. The semiconductor light emitting device of claim 10, wherein a distance between an upper surface of the multilayer reflection film and a lower surface of the quantum well active layer is 0.4 µm or less.

13. The semiconductor light emitting device of claim 10, wherein the quantum well active layer having a quantum well active layer comprises $Al_yGa_zIn_{1-y-z}P(0 \leq y \leq 1, 0 \leq z \leq 1)$.

14. The semiconductor light emitting device of claim 10, wherein the multilayer reflection film is composed of a pair of $Al_yGa_zIn_{1-y-z}P(0 \leq y \leq 1, 0 \leq z \leq 1)$ and $Al_xGa_{1-x}As(0.4 \leq x \leq 1)$ layers.

15. The semiconductor light emitting device of claim 10, wherein a maximum reflectance of the multilayer reflection film against a ray of light from the quantum well active layer is 80% or more.

* * * * *